United States Patent [19]
Chan et al.

[11] Patent Number: 5,929,695
[45] Date of Patent: Jul. 27, 1999

[54] INTEGRATED CIRCUIT HAVING SELECTIVE BIAS OF TRANSISTORS FOR LOW VOLTAGE AND LOW STANDBY CURRENT AND RELATED METHODS

[75] Inventors: Tsiu Chiu Chan, Carrollton; Pervez Hassan Sagarwala, Grand Prairie, both of Tex.

[73] Assignee: STMicroelectronics, Inc., Carrollton, Tex.

[21] Appl. No.: 08/867,538

[22] Filed: Jun. 2, 1997

[51] Int. Cl.[6] .................................................. G05F 1/10
[52] U.S. Cl. ........................ 327/537; 327/534; 327/535; 327/544; 326/36
[58] Field of Search ...................... 327/530, 535, 327/537, 544, 546, 545, 534; 326/36

[56] References Cited

U.S. PATENT DOCUMENTS

| | | | |
|---|---|---|---|
| 3,702,990 | 11/1972 | Ross | 327/534 |
| 4,142,114 | 2/1979 | Green | 307/304 |
| 4,458,212 | 7/1984 | Brehmer et al. | 330/260 |
| 4,933,827 | 6/1990 | Olivo et al. | 363/60 |
| 4,987,088 | 1/1991 | Bergonzoni et al. | 437/34 |
| 5,099,148 | 3/1992 | McClure et al. | 307/443 |
| 5,303,189 | 4/1994 | Devin et al. | 365/189.06 |
| 5,349,220 | 9/1994 | Hong | 257/322 |
| 5,394,026 | 2/1995 | Yu et al. | 327/536 |
| 5,397,934 | 3/1995 | Merrill et al. | 327/537 |
| 5,448,198 | 9/1995 | Toyoshima et al. | 327/534 |
| 5,461,338 | 10/1995 | Hirayama et al. | 327/534 |
| 5,526,313 | 6/1996 | Etoh et al. | 365/205 |
| 5,583,457 | 12/1996 | Horiguchi et al. | 326/121 |
| 5,600,588 | 2/1997 | Kawashima | 365/154 |
| 5,610,533 | 3/1997 | Arimoto et al. | 326/33 |
| 5,612,643 | 3/1997 | Hirayama | 327/534 |
| 5,612,645 | 3/1997 | Halepete | 327/537 |
| 5,672,995 | 9/1997 | Hirase et al. | 327/534 |

FOREIGN PATENT DOCUMENTS

| | | | |
|---|---|---|---|
| 0846997 A2 | 11/1997 | European Pat. Off. | G05F 3/24 |
| 0846998 A2 | 11/1997 | European Pat. Off. | G05F 3/24 |

*Primary Examiner*—Timothy P. Callahan
*Assistant Examiner*—Jung Ho Kim
*Attorney, Agent, or Firm*—Theodore E. Galanthay; Lisa K. Jorgenson; Christopher F. Regan

[57] ABSTRACT

An integrated circuit includes a plurality of MOSFETs on a substrate. The plurality of MOSFETs preferably includes at least one MOSFET having a first conductivity type and at least one MOSFET having a second conductivity type. Each MOSFET has an initial threshold voltage. The integrated circuit also preferably includes first and second biasing circuits which selectively bias only a selected well a corresponding conductivity type of the plurality of MOSFETs to produce an absolute value of an effective threshold voltage of only the selected MOSFET which is lower than an absolute value of the initial threshold voltage thereof and thereby inhibit a high standby current for the integrated circuit. Method aspects of the invention are also disclosed.

25 Claims, 2 Drawing Sheets

INTEGRATED CIRCUIT HAVING SELECTIVE BIAS OF TRANSISTORS FOR LOW VOLTAGE AND LOW STANDBY CURRENT AND RELATED METHODS

FIELD OF THE INVENTION

The present invention relates to the field of semiconductors and, more particularly, to an integrated circuit comprising a plurality of metal-oxide semiconductor field-effect transistors ("MOSFETs") and related methods.

BACKGROUND OF THE INVENTION

Integrated circuits are widely used in many electronic devices. A typical relatively complicated integrated circuit may include hundreds of thousands or millions of transistors on a substrate. One type of transistor commonly used in an integrated circuit is the metal-oxide semiconductor field-effect transistor ("MOSFET"). A MOSFET includes source and drain regions connected by a channel. A gate overlies the channel and is separated therefrom by an insulating layer, such as typically provided by silicon dioxide ($SiO_2$). A control voltage applied to the gate controls the flow of charge carriers through the channel between the source and drain.

A depletion-mode MOSFET includes a doped or conducting channel under the gate when no voltage is applied to the gate. An enhancement-mode MOSFET, in contrast, requires that a gate-to-source bias voltage be applied to create an inversion layer to serve as a conducting channel. This voltage is the threshold voltage Vt. For an n-channel enhancement-mode MOSFET a positive voltage between the gate and source induces the channel. Thus, the current will only flow when the gate-to-source voltage exceeds the threshold voltage Vt. Similarly, for a p-channel enhancement-mode MOSFET, current flows when the gate-to-source voltage is negative below the negative threshold voltage.

The threshold voltage of an enhancement-mode MOSFET is determined by a number of factors, including the channel length, channel width, doping, gate oxide thickness, and back-gate biasing. Extrinsic factors, such as the ambient temperature, also affect the threshold voltage. If the Vt value is too low for a desired supply voltage, the transistor may have unacceptable leakage current if the supply voltage is greater than the desired supply voltage. Conversely, if the Vt is chosen relatively high, then there is a reduced likelihood that the transistor will fully switch on. Although modern semiconductor manufacturing processes can be controlled, there is still a spread of Vt values across integrated circuit dies within production runs.

It may also be desirable to use lower supply voltages for MOSFET integrated circuits to thereby reduce power consumption, such as for a cellular phone or a pager powered by a rechargeable battery, for example. Since the spread of threshold voltages based upon process variations is about the same irrespective of the supply voltage, Vt becomes a larger percentage as the supply voltage is reduced. As the supply voltage is reduced, control over Vt and the spread thereof for the transistors becomes more critical. When the supply voltages are reduced to about 1 volt or below, without accurate control of Vt, fewer and fewer integrated circuits may be acceptable as manufacturing yields decrease. Analog circuits, for example, can be particularly susceptible to variations in Vt.

U.S. Pat. No. 4,142,114 to Green, for example, describes regulation of Vt for a plurality of MOSFETs on a common substrate which is achieved by adjusting the back bias on the substrate using a charge pump that is selectively operated when the Vt of a designated enhancement-mode FET falls below a reference voltage. A voltage divider provides the reference voltage that is applied to the gate of the designated enhancement-mode MOSFET, which when turned on enables the charge pump. The Vt of a designated enhancement-mode MOSFET is detected by applying a reference voltage to its gate. The charge pump raises the Vt of the MOSFETs on the substrate to within a predetermined range of a reference voltage. In other words, the patent discloses an example of so-called negative back gate bias, wherein the Vt of the transistors is raised. Unfortunately, raising the Vt reduces the available voltage headroom and prevents operating at lower supply voltages. Moreover, the sensing and charge pump circuit components include MOSFETs which have Vt's, that is, the variable to be controlled. In addition, a high effective threshold voltage may result in damage to relatively thin gate oxide layers of the MOSFETs.

U.S. Pat. No. 5,397,934 to Merrill et al. also describes a compensation circuit for the threshold voltages of a plurality of MOSFETS on an integrated circuit die. In particular, a portion of the circuit generates a reference voltage. Threshold voltage monitoring circuitry includes a MOSFET transistor and a resistor connected in series therewith to generate a second voltage signal. Feedback circuitry compares the reference voltage to the second voltage signal and adjusts the effective threshold voltage of the MOS transistor so that the reference voltage is substantially equal to the second voltage signal. As described above, the compensation circuitry includes devices which are themselves subject to the variation in threshold voltage.

SUMMARY OF THE INVENTION

In view of the foregoing, the present invention advantageously provides an integrated circuit having metal-oxide semiconductor field-effect transistors ("MOSFETs") with accurately compensated effective threshold voltages to facilitate operation at relatively low power supply voltages. The present invention additionally provides an integrated circuit having MOSFETs with selectively compensated effective threshold voltages to thereby inhibit high standby currents. The present invention yet also advantageously provides an integrated circuit having a low power supply voltage without compromising circuit performance or requirements. The present invention still further advantageously provides an integrated circuit which has portions thereof that can be selectively turned-on or powered up for use during a short period of time and then turned off.

This and other objects, features and advantages in accordance with the present invention are provided by an integrated circuit having a substrate and a plurality of MOSFETs on the substrate. The plurality of MOSFETs preferably include at least one MOSFET having a first conductivity type. Each MOSFET of the plurality of MOSFETs has an initial threshold voltage. The integrated circuit also preferably includes selective well biasing means connected to the at least one MOSFET having the first conductivity type for selectively biasing only the well of the at least one MOSFET to produce an absolute value of an effective threshold voltage of only the selected MOSFET which is lower than an absolute value of the initial threshold voltage thereof.

In other embodiments of an integrated circuit of the present invention, the plurality of MOSFETs preferably include at least one MOSFET having a first conductivity type and at least one MOSFET having a second conductivity type. Each MOSFET of the plurality of MOSFETs has an initial threshold voltage. The integrated circuit also preferably includes selective well biasing means connected to the plurality of MOSFETs for selectively biasing only a selected well of the plurality of MOSFETs to produce an absolute value of an effective threshold voltage of only the selected MOSFET which is lower than an absolute value of the initial threshold voltage thereof and thereby inhibit a high standby current.

According to other aspects of the present invention, the selective well biasing means preferably includes well isolating means for isolating wells of the plurality of MOSFETs which have the same conductivity type so that biasing of only the selected well reduces the effective threshold voltage of only a selected MOSFET. The plurality of MOSFETs has a spread of low to high absolute values of initial threshold voltages. The selective well biasing means preferably selectively biases only the selected MOSFET so that a spread of low to high absolute values of effective threshold voltages of the selected MOSFET has a high effective threshold voltage less than or equal to the low absolute value of initial threshold voltage of the selected MOSFET. The selective well biasing means is preferably provided by a first MOSFET having the first conductivity type, a second MOSFET having the second conductivity type, and a plurality of diodes connected in series and connected to the first and second MOSFETs.

During active operation of an integrated circuit according to the present invention, the forward back-gate biasing of the n-channel and p-channel MOSFETs, for example, advantageously reduces the threshold voltages. This allows lower supply voltages to readily be accommodated. In addition, the lower effective threshold voltages also permit operation at lower voltages which, in turn, permit a thinner gate oxide layer, while reducing the likelihood of damaging the gate oxide. The thinner gate oxide also, for example, can permit higher operating speeds.

The present invention also advantageously includes methods of making and operating an integrated circuit. A method of making an operating an integrated circuit preferably includes providing a substrate and forming a plurality of MOSFETs on the substrate. The plurality of MOSFETs include at least one MOSFET having a first conductivity type and at least one MOSFET having a second conductivity type. Each MOSFET of the plurality of MOSFETs has an initial threshold voltage. The method also includes selectively biasing only a selected well of the plurality of MOSFETs to produce an absolute value of an effective threshold voltage of only the selected MOSFET which is lower than an absolute value of the initial threshold voltage thereof and thereby inhibit a high standby current.

A method of operating an integrated circuit according to the present invention preferably includes selectively biasing only a selected well of an MOSFET of a plurality of MOSFETs of an integrated circuit. Each of the plurality of MOSFETs has an initial threshold voltage. The selective biasing advantageously produces an absolute value of an effective threshold voltage of only the selected MOSFET which is lower than an absolute value of the initial threshold voltage thereof so as to inhibit a high standby current for the integrated circuit. The method can also advantageously include supplying the plurality of MOSFETs with a supply voltage of less than about 1 volt.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout.

Figure 1:
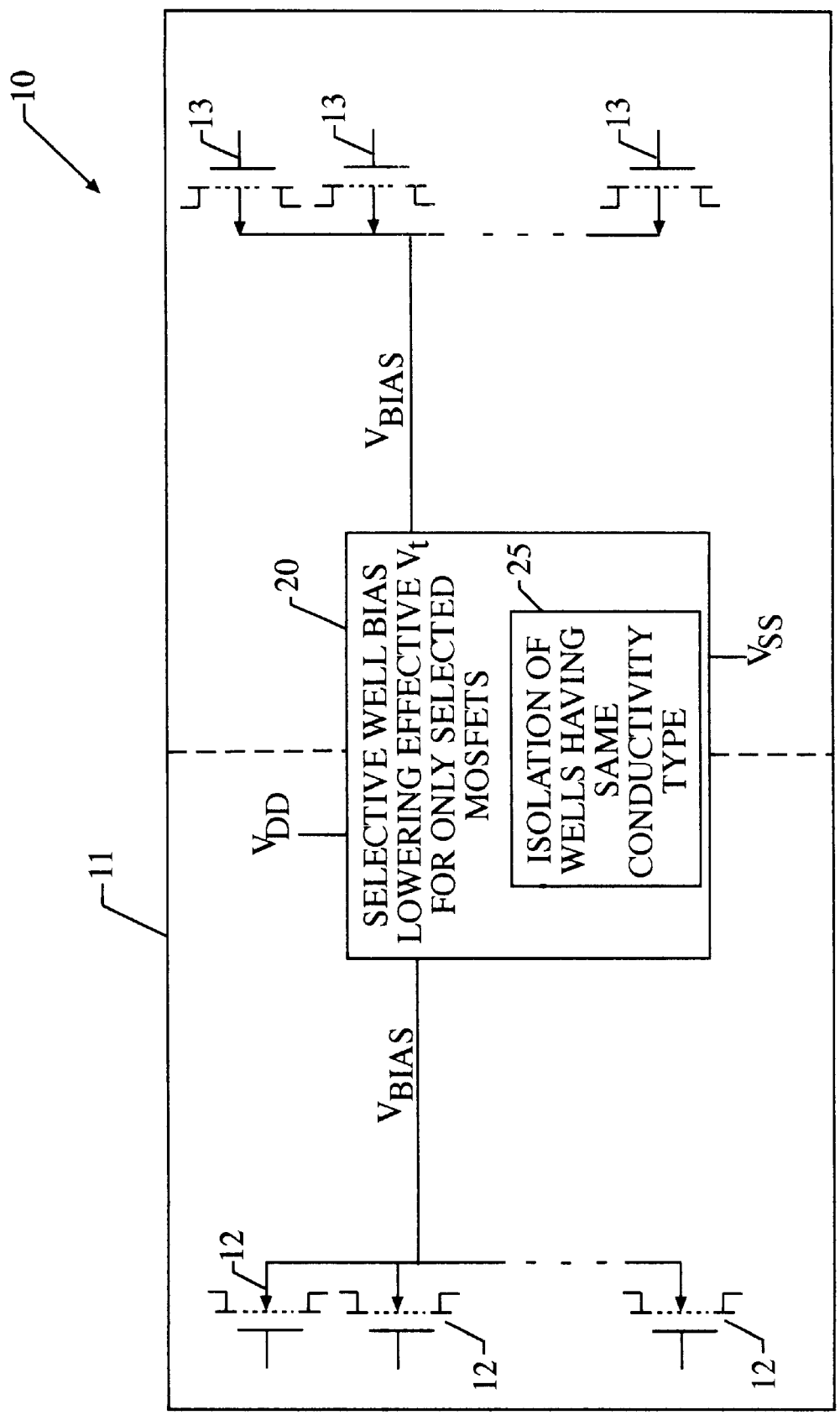
FIG. 1 is a schematic block diagram of an embodiment of an integrated circuit in accordance with the present invention.

FIG. 1 illustrates an integrated circuit 10 in accordance with the present invention. The integrated circuit 10 has a substrate 11 and a plurality of enhancement-mode metal-oxide semiconductor field-effect transistors ("MOSFETs") 12, 13 formed on the substrate 11 as would be readily understood by those skilled in the art. The illustrated integrated circuit 10 includes both p-channel MOSFETs 13 and n-channel MOSFETs 12 in a complimentary metal oxide semiconductor ("CMOS") circuit as would also be readily understood by those skilled in the art. Accordingly, the plurality of MOSFETs 12, 13 preferably include at least one MOSFET having a first conductivity type 12 and preferably also include at least one MOSFET 13 having a second conductivity type.

Each MOSFET of the plurality of MOSFETs 12, 13 has an initial threshold voltage $Vt_{INI}$ dependent at least in part on design parameters and processing variations. The plurality of MOSFETs 12, 13 also is advantageously operable from a supply voltage $V_{DD}$ of less than about 1 volt. Related integrated circuits are also illustrated in co-pending U.S. patent application Ser. No. 08/758,933 filed on Dec. 3, 1997, co-pending U.S. patent application Ser. No. 08/770,548 filed on Dec. 3, 1997, and co-pending U.S. patent application Ser. No. 08/758,930 filed on Dec. 3, 1997 which are all assigned to the same assignee of the present application and which are collectively hereby incorporated herein by reference in their entireties.

Advantageously, the integrated circuit 10 of the present invention also preferably includes selective well biasing means 20 connected to the at least one MOSFET 12 having the first conductivity type for selectively biasing only the p-well or p-tub of at least one n-channel MOSFET 12 (see FIG. 3) or the n-well or n-tub of at least one p-channel MOSFET 13 (see FIG. 2) to produce an absolute value of an effective threshold voltage $Vt_{EFF}$ of only the selected MOSFET 12, 13 which is lower than an absolute value of the initial threshold voltage $Vt_{INI}$ thereof.

The plurality of MOSFETs 12, 13 has a spread of low to high absolute values of initial threshold voltages $Vt_{INI}$. The selective well biasing means 20 preferably selectively biases only the selected MOSFET 12, 13 so that a spread of low to high absolute values of effective threshold voltages $Vt_{EFF}$ of the selected MOSFET 12, 13 has a high effective threshold voltage $Vt_{EFF}$ less than or equal to the low absolute value of initial threshold voltage $Vt_{INI}$ of the selected MOSFET 12, 13.

According to other aspects of the present invention, the selective well biasing means 20 preferably includes well isolating means 25 for isolating the wells or tubs of the plurality of MOSFETs 12, 13 which have the same conductivity type so that biasing of only the selected well reduces the effective threshold voltage of only a selected MOSFET 12, 13. The well isolating means 25 is preferably provided by a triple well configuration of the plurality of MOSFETs 12, 13 using the same substrate 11 as understood by those skilled in the art. For example, for a triple well configuration, if the substrate 11 is a p-type substrate, then an n-well can be formed in the p-type substrate, e.g., through implantation. A first p-well can also be formed in the p-type substrate, e.g., through implantation. A second p-well can then be formed in the n-well so that the first and second p-wells and the n-well define the triple well configuration. As understood by those skilled in the art, the conductivity types could also be interchanged for an n-type substrate, for example.

The MOSFETs 12, 13 and the associated circuitry of the integrated circuit 10 can then be formed on the same substrate 11, e.g., p-channel MOSFETs in the n-well and n-channel MOSFETs in the first or second p-well, and separately biased. This, for example, advantageously allows only specific or selected wells or tubs of the MOSFETs 12, 13 to be forward biased at a selected time so that all the threshold voltages Vt of the MOSFETs 12, 13 are not simultaneously reduced, but instead are only selectively reduced. This configuration thereby advantageously produces a low standby current or inhibits a high standby current due to subthreshold leakage.

Figures 2, 3:
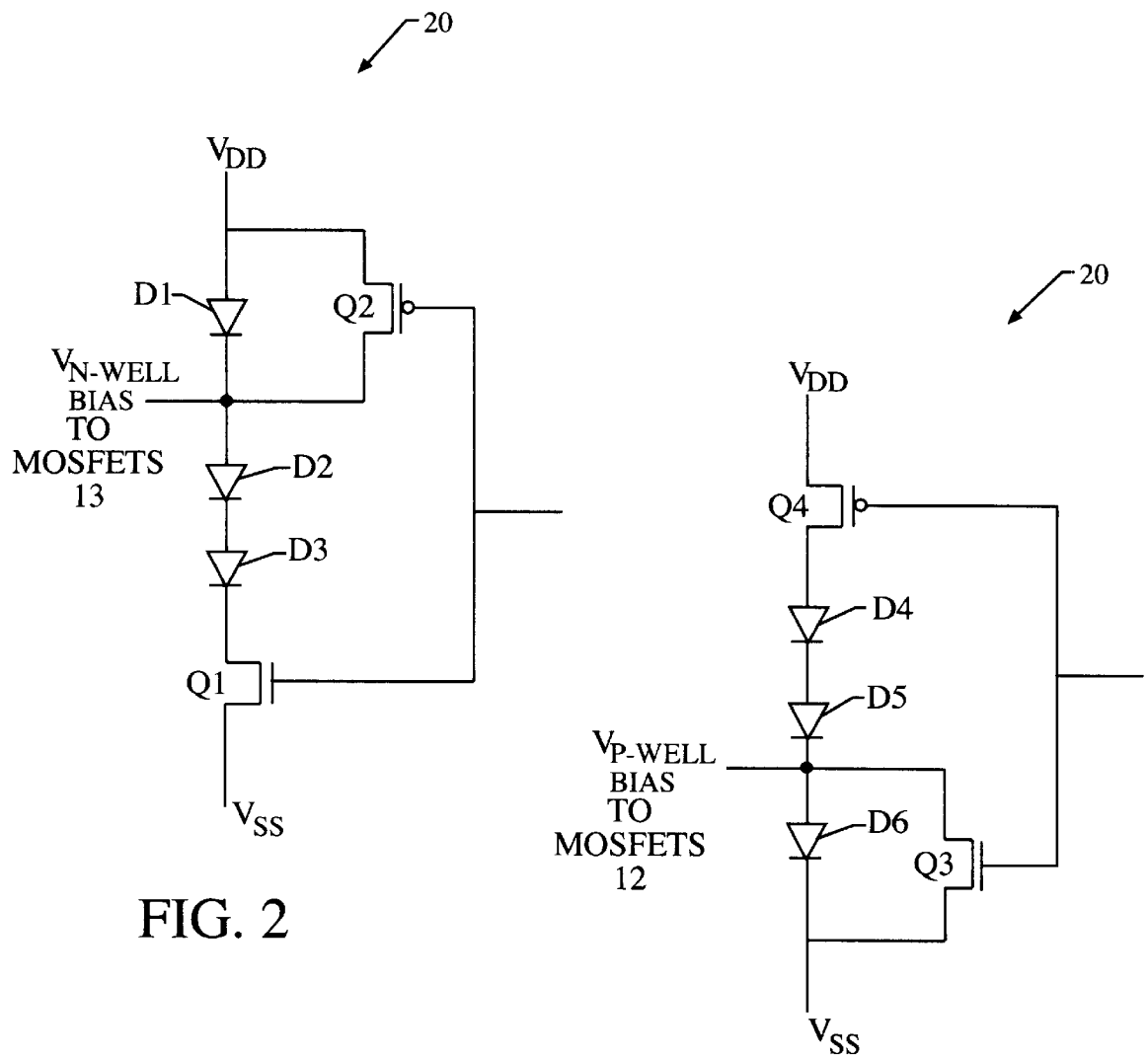
FIG. 2 is a schematic circuit diagram of a portion of an integrated circuit in accordance with the present invention.
FIG. 3 is a schematic circuit diagram of another portion of an integrated circuit in accordance with the present invention.

As best illustrated in FIGS. 2–3, the selective well biasing means 20 is preferably provided first conductivity well biasing means which includes a first MOSFET Q1, e.g., n-channel, having the first conductivity type, a second MOSFET Q2, e.g., p-channel, having the second conductivity type, and a plurality of diodes D1, D2, D3 connected in series and connected to the first and second MOSFETs Q1, Q2 (see FIG. 2). The gates of the first and second MOSFETs Q1, Q2 are preferably commonly tied or tied together as understood by those skilled in the art. The selective well biasing means 20 also is provided by second conductivity well biasing means which includes a third MOSFET Q3, e.g., n-channel, having the first conductivity type, a fourth MOSFET Q4, e.g., p-channel, having the second conductivity type, and a plurality of diodes D4, D5, D6 connected in series and connected to the third and fourth MOSFETs Q3, Q4 (see FIG. 3). Likewise, the gates of the third and fourth MOSFETs Q3, Q4 also are preferably commonly tied or tied together as understood by those skilled in the art.

For providing an n-well bias as illustrated in FIG. 2, the plurality of diodes is preferably at least three diodes D1, D2, D3. A first diode D1 preferably is connected to the supply voltage $V_{DD}$ and to the source and drain of the second MOSFET Q2, i.e., the anode to the drain and the cathode to the source as illustrated. The second and third diodes D2, D3 are preferably connected in series to the first diode D1 and to only the drain of the first MOSFET Q1, i.e., the anode of the second diode D2 to the drain of the second MOSFET Q2, the cathode of the second diode D2 to the anode of the third diode D3, and the cathode of the third diode D3 to the drain of the first MOSFET Q1 as illustrated. The source of the first MOSFET Q1 is preferably connected to ground $V_{SS}$. As understood by those skilled in the art, the use of integrated diodes in the integrated circuit 10 advantageously allows any one of the semiconductor junctions forming the monolithic circuit structure to be used as a diode.

In operation, the n-well is normally tied to the supply voltage $V_{DD}$. When the gate voltage for the transistors Q1, Q2 is 0 volts, then the first n-channel MOSFET Q1 is turned off and the second p-channel MOSFET Q2 is turned on. When the gate voltage is at the supply voltage $V_{DD}$ or 1 volt, then the first n-channel MOSFET Q1 is turned on and the second p-channel MOSFET Q2 is turned off. The plurality of diodes D1, D2, D3 each respectively cause a voltage drop from the supply voltage $V_{DD}$ to the first n-channel MOSFET Q1. For example, if each of the diodes D1, D2, D3 had an equal value, then the voltage drop across each of the diodes would be about one-third of the 1 volt supply voltage so that the voltage at the drain of the first MOSFET Q1 is about 0 volts. This also illustrates that the values of the diodes D1, D2, D3 can be respectively flexibly adjusted to accomplish the design goals. This further illustrates that only two diodes or more than three diodes can be used as well for this portion of the integrated circuit 10 according to the present invention.

For providing a p-well bias as illustrated in FIG. 3, the plurality of diodes is also preferably at least three diodes D4, D5, D6. The fourth and fifth diodes D4, D5 are connected in series to only the drain of the fourth MOSFET Q4, i.e., the anode of the fourth diode D4 to the drain of the fourth MOSFET Q4, the cathode of the fourth diode D4 to the anode of the fifth diode D5, and the cathode of the fifth diode D5 to the drain of the third MOSFET Q3 as illustrated. The source of the fourth MOSFET Q4 is also preferably connected to the supply voltage $V_{DD}$. A sixth diode D6 is connected to the drain and the source of the third MOSFET Q3, i.e., the anode to the cathode of the fifth diode D5 and to the drain of the third MOSFET Q3 and the cathode to the source of the third MOSFET Q3 as illustrated. The source of third MOSFET Q3 is also connected to ground $V_{SS}$.

In operation, the p-well is normally tied to the voltage at $V_{SS}$. When the gate voltage for the transistors Q3, Q4 is at the supply voltage $V_{DD}$ volts or 1 volt, then the third n-channel MOSFET Q3 is turned on and the fourth p-channel MOSFET Q4 is turned off. When the gate voltage is 0 volt, then the third n-channel MOSFET Q3 is turned off and the fourth p-channel MOSFET Q4 is turned on. The plurality of diodes D4, D5, D6 also each respectively cause a voltage drop from the voltage at $V_{SS}$ to the fourth MOSFET Q4. For example, if each of the diodes D4, D5, D6 had an equal value, then the voltage drop across each of the diodes would be about one-third of the 1 volt supply voltage so that the voltage at the drain of the fourth MOSFET Q4 is about at $V_{DD}$ or 1 volt. Likewise, this also illustrates that the values of the diodes D4, D5, D6 can be respectively flexibly adjusted to accomplish the design goals and that only two diodes or more than three diodes can be used as well according to the present invention.

As would be readily understood by those skilled in the art, the selective well biasing arrangement of the present invention may be included for an integrated circuit including only n-channel or p-channel MOSFETs. In addition, the selective well biasing arrangement may only be needed on one or the other of n-channel or p-channel MOSFETs where both types of transistors are included in the integrated circuit. For example, the selective well biasing to produce a lowered $Vt_{EFF}$ and a lowered standby current may be used only on the n-channel MOSFETs even where p-channel MOSFETs are also included. The integrated circuit 10 of the present invention thereby advantageously provides an integrated circuit 10 which has portions thereof that can be selectively turned-on or powered up for use during a short period of time, e.g., 1–2 seconds, and then turned off.

The effective threshold voltages $Vt_{EFF}$ can advantageously be determined or selected by adding more than three diodes in series depending on the desired well's bias voltages. Also, the sizes of the diodes can be different for fine tuning the desired well's bias voltages. During active operation, as understood by those skilled in the art, the forward back-gate biasing of the n-channel and p-channel MOSFETs is not a penalty and advantageously allows the reduction of the threshold voltages. This allows lower supply voltages $V_{DD}$ to readily be accommodated. In addition, the lower effective threshold voltages $Vt_{EFF}$ also permit operation at lower supply voltages $V_{DD}$ which, in turn, permits a thinner gate oxide layer, while reducing the likelihood of damaging the gate oxide. The thinner gate oxide also, for example, can permit higher operating speeds.

As illustrated in FIGS. 1–3, and as described above herein, the present invention also advantageously includes methods of making and operating an integrated circuit 10. A method of making an operating an integrated circuit 10 preferably includes providing a substrate 11 and forming a plurality of MOSFETs 12, 13 on the substrate 11. The MOSFETs 12, 13 are formed by conventional semiconductor manufacturing techniques as would be readily understood by those skilled in the art. The plurality of MOSFETs 12, 13 includes at least one MOSFET having a first conductivity type and at least one MOSFET having a second conductivity type. Each MOSFET of the plurality of MOSFETs 12, 13 has an initial threshold voltage $Vt_{INI}$. The method also includes selectively biasing only a selected well of the plurality of MOSFETs 12, 13 to produce an absolute value of an effective threshold voltage $Vt_{EFF}$ of only the selected MOSFET which is lower than an absolute value of the initial threshold voltage $Vt_{INI}$ thereof and thereby inhibit a high standby current.

This method can also include isolating wells of the plurality of MOSFETs 12, 13 having the same conductivity type so that biasing of only the selected well reduces the effective threshold voltage $Vt_{EFF}$ of only a selected MOSFET. The plurality of MOSFETs 12, 13 preferably has a spread of low to high absolute values of initial threshold voltages. The selectively biasing step preferably includes selectively biasing only the selected MOSFET so that a spread of low to high absolute values of effective threshold voltages $Vt_{EFF}$ of the selected MOSFET has a high effective threshold voltage less than or equal to the low absolute value of initial threshold voltage $Vt_{INI}$ of the selected MOSFET. The selective biasing step can also include biasing the well of the at least one MOSFET having the first conductivity type and biasing the well of the at least one MOSFET having the second conductivity type.

The method can further include forming a first MOSFET Q1 having the first conductivity type, a second MOSFET Q2 having the second conductivity type, and a plurality of diodes D1, D2, D3 connected in series and connected to the first and second MOSFETs Q1, Q2. The plurality of diodes preferably form a first plurality of diodes D1, D2, D3, and the method further includes forming a third MOSFET Q3 having the first conductivity type, a fourth MOSFET Q4 having the second conductivity type, and a second plurality of diodes D4, D5, D6 connected in series and connected to the third and fourth MOSFETs Q3, Q4. As described above, the plurality of MOSFETs 12, 13 can advantageously be operated at a supply voltage of less than about 1 volt.

A method of operating an integrated circuit 10 according to the present invention preferably includes selectively biasing only a selected well of an MOSFET of a plurality of MOSFETs 12, 13 of an integrated circuit 10. Each of the plurality of MOSFETs 12, 13 has an initial threshold voltage $Vt_{INI}$. The selective biasing advantageously produces an absolute value of an effective threshold voltage $Vt_{EFF}$ of only the selected MOSFET which is lower than an absolute value of the initial threshold voltage $V_{INI}$ thereof so as to inhibit a high standby current for the integrated circuit 10. The method can also advantageously include supplying the plurality of MOSFETs 12, 13 with a supply voltage $V_{DD}$ of less than about 1 volt. The plurality of MOSFETs 12, 13 has a spread of low to high absolute values of initial threshold voltages $Vt_{INI}$. The selectively biasing step preferably includes selectively biasing only the selected MOSFET so that a spread of low to high absolute values of effective threshold voltages $Vt_{EFF}$ of the selected MOSFET has a high effective threshold voltage $Vt_{EFF}$ less than or equal to the low absolute value of initial threshold voltage $Vt_{INI}$ of the selected MOSFET.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

That which is claimed:

1. An integrated circuit comprising:

a substrate;

a plurality of metal-oxide semiconductor field-effect transistors (MOSFETs) on said substrate, said plurality of MOSFETs including at least one MOSFET having a first conductivity type and at least one MOSFET having a second conductivity type, each MOSFET having an initial threshold voltage; and selective well biasing means connected to said plurality of MOSFETs for selectively biasing only a selected well of the plurality of MOSFETs to produce an absolute value of an effective threshold voltage of only the selected MOSFET which is lower than an absolute value of the initial threshold voltage thereof, said selective well biasing means including well isolating means for isolating wells of said plurality of MOSFETs having the same conductivity type from each other so that biasing of only the selected well reduces the effective threshold voltage of only the selected MOSFET, first conductivity well biasing means for biasing a well of the at least one MOSFET having the first conductivity type, and second conductivity well biasing means for biasing a well of the at least one MOSFET having the second conductivity type, each of said first conductivity well biasing means and said second conductivity well biasing means includes a first MOSFET having the first conductivity type, a second MOSFET having the second conductivity type, and a plurality of diodes connected in series and connected to the first and second MOSFETs.

2. An integrated circuit as defined in claim 1, wherein said plurality of MOSFETs has a range of low to high absolute values of initial threshold voltages, and wherein said selective well biasing means selectively biases only the selected MOSFET so that a range of low to high absolute values of effective threshold voltages of said selected MOSFET has a high bound effective threshold voltage which is less than or equal to the low bound absolute value of the initial threshold voltage of the selected MOSFET.

3. An integrated circuit as defined in claim 1, wherein said plurality of diodes of said first conductivity well biasing means comprises at least three diodes, a first diode being connected to the source and drain of the second MOSFET and second and third diodes connected in series to only the drain of the first MOSFET.

4. An integrated circuit as defined in claim 1, wherein said plurality of diodes of said second conductivity well biasing means comprises at least three diodes, first and second diodes connected in series to only the drain of the second MOSFET and a third diode connected to the drain and the source of the first MOSFET.

5. An integrated circuit as defined in claim 1, wherein said plurality of MOSFETs is operable from a supply voltage of 1 volt or less.

6. An integrated circuit as defined in claim 1, wherein each of said plurality of MOSFETs comprises an enhancement-mode MOSFET.

7. An integrated circuit comprising:
a substrate;
a plurality of metal-oxide semiconductor field-effect transistors (MOSFETS) on said substrate, said plurality of MOSFETs including at least one MOSFET having a first conductivity type, each MOSFET having an initial threshold voltage, said plurality of MOSFETs having a range of low to high absolute values of initial threshold voltages; and
selective well biasing means connected to the at least one MOSFET having the first conductivity type for selectively biasing only a well of the at least one MOSFET to produce an absolute value of an effective threshold voltage of only the selected MOSFET which is lower than an absolute value of the initial threshold voltage thereof, said selective well biasing means including well isolating means for isolating wells of said plurality of MOSFETs having the same conductivity type from each other so that biasing of only the selected well reduces the effective threshold voltage of only the selected, a first MOSFET having the first conductivity type, a second MOSFET having the second conductivity type, and a plurality of diodes connected in series and connected to the first and second MOSFETs, said selective well biasing means also selectively biases only the selected MOSFET so that a range of low to high absolute values of effective threshold voltages of said selected MOSFET has a high bound effective threshold voltage which is less than or equal to the low bound absolute value of the initial threshold voltage of the selected MOSFET.

8. An integrated circuit as defined in claim 7, wherein said plurality of diodes comprises at least three diodes, a first diode being connected to the source and drain of the second MOSFET and second and third diodes connected in series to only the drain of the first MOSFET.

9. An integrated circuit as defined in claim 7, wherein said plurality of diodes comprises at least three diodes, first and second diodes connected in series to only the drain of the second MOSFET and a third diode connected to the drain and the source of the first MOSFET.

10. An integrated circuit as defined in claim 7, wherein said plurality of MOSFETs is operable from a supply voltage of 1 volt or less.

11. An integrated circuit as defined in claim 7, wherein each of said plurality of MOSFETs comprises an enhancement-mode MOSFET.

12. An integrated circuit comprising:
a substrate;
a plurality of metal-oxide semiconductor field-effect transistors (MOSFETs) on said substrate, said plurality of MOSFETs including at least one MOSFET having a first conductivity type and at least one MOSFET having a second conductivity type, each MOSFET having an initial threshold voltage, said plurality of MOSFETs also having a range of low to high absolute values of initial threshold voltages; and
selective well biasing means connected to said plurality of MOSFETs for selectively biasing only a selected well of the plurality of MOSFETs to produce an absolute value of an effective threshold voltage of only the selected MOSFET which is lower than an absolute value of the initial threshold voltage thereof, said selective well biasing means including first conductivity well biasing means for biasing a well of the at least one MOSFET having the first conductivity type, second conductivity well biasing means for biasing a well of the at least one MOSFET having the second conductivity type, and well isolating means for isolating wells of said plurality of MOSFETs having the same conductivity type from each other so that biasing of only the selected well reduces the effective threshold voltage of only the selected MOSFET, each of said first conductivity well biasing means and said second conductivity well biasing means includes a first MOSFET having the first conductivity type, a second MOSFET having the second conductivity type, and a plurality of diodes connected in series and connected to the first and second MOSFETs, said selective well biasing means also selectively biasing only a selected MOSFET so that a range of low to high absolute values of effective threshold voltages of said selected MOSFET has a high bound effective threshold voltage which is less than or equal to the low bound absolute value of the initial threshold voltage of the selected MOSFET.

13. An integrated circuit as defined in claim 12, wherein said plurality of diodes of said first conductivity well biasing means comprises at least three diodes, a first diode being connected to the source and drain of the second MOSFET and second and third diodes connected in series to only the drain of the first MOSFET.

14. An integrated circuit as defined in claim 13, wherein said plurality of diodes of said second conductivity well biasing means comprises at least three diodes, first and second diodes connected in series to only the drain of the second MOSFET and a third diode connected to the drain and the source of the first MOSFET.

15. An integrated circuit as defined in claim 14, wherein said plurality of MOSFETs is operable from a supply voltage of 1 volt or less.

16. An integrated circuit as defined in claim 15, wherein each of said plurality of MOSFETs comprises an enhancement-mode MOSFET.

17. A method of making and operating an integrated circuit, the method comprising:
providing a substrate;
forming a plurality of metal-oxide semiconductor field-effect transistors (MOSFETs) on said substrate, said plurality of MOSFETs including at least one MOSFET having a first conductivity type and at least one MOSFET having a second conductivity type, and a plurality of diodes connected in series and connected to the at least one MOSFET of the first conductivity type or the at least one MOSFET of the second conductivity type, each MOSFET having an initial threshold voltage; and selectively biasing only a selected well of the plurality of MOSFETs to produce an absolute value of an effective threshold voltage of only the selected MOSFET which is lower than an absolute value of the initial threshold voltage thereof.

18. A method as defined in claim 17, further comprising isolating wells of the plurality of MOSFETs having the same conductivity type from each other so that biasing of only the selected well reduces the effective threshold voltage of only the selected MOSFET.

19. A method as defined in claim 17, wherein the plurality of MOSFETs has a range of low to high absolute values of initial threshold voltages, and wherein the selectively biasing step includes selectively biasing only the selected MOSFET so that a range of low to high absolute values of effective threshold voltages of said selected MOSFET has a high bound effective threshold voltage which is less than or equal to the low bound absolute value of the initial threshold voltage of the selected MOSFET.

20. A method as defined in claim 17, wherein the selectively biasing step includes biasing a well of the at least one MOSFET having the first conductivity type and biasing a well of the at least one MOSFET having the second conductivity type.

21. A method as defined in claim 17, wherein the plurality of diodes comprises a first plurality of diodes, and wherein the method further comprises forming a third MOSFET having the first conductivity type, a fourth MOSFET having the second conductivity type, and a second plurality of diodes connected in series and connected to the third and fourth MOSFETs.

22. A method as defined in claim 17, further comprising operating the plurality of MOSFETs at a supply voltage of 1 volt or less.

23. A method of operating an integrated circuit, the method comprising selectively biasing only a selected well of a metal-oxide semiconductor field-effect transistor (MOSFET) of a plurality of MOSFETs of an integrated circuit each of which has an initial threshold voltage to thereby produce an absolute value of an effective threshold voltage of only the selected MOSFET which is lower than an absolute value of the initial threshold voltage thereof the selectively biasing of only a selected well being performed by the use of a plurality of metal-oxide semiconductor field-effect transistors (MOSFETs) on a substrate, the plurality of MOSFETs including at least one MOSFET having a first conductivity type and at least one MOSFET having a second conductivity type, and a plurality of diodes connected in series and connected to the at least one MOSFET of the first conductivity type and the at least one MOSFET of the second conductivity type, each MOSFET having an initial threshold voltage.

24. A method as defined in claim 23, wherein the plurality of MOSFETs has a range of low to high absolute values of initial threshold voltages, and wherein the selectively biasing step includes selectively biasing only the selected MOSFET so that a range of low to high absolute values of effective threshold voltages of said selected MOSFET has a high bound effective threshold voltage which is less than or equal to the low bound absolute value of the initial threshold voltage of the selected MOSFET.

25. A method as defined in claim 23, further comprising supplying the plurality of MOSFETs with a supply voltage of 1 volt or less.

* * * * *